United States Patent [19]

Gersbach et al.

[11] Patent Number: 5,382,922
[45] Date of Patent: Jan. 17, 1995

[54] CALIBRATION SYSTEMS AND METHODS FOR SETTING PLL GAIN CHARACTERISTICS AND CENTER FREQUENCY

[75] Inventors: John E. Gersbach, Burlington; Masayuki Hayashi, Williston, both of Vt.

[73] Assignee: International Business Machines Corporation, Armonk, N.Y.

[21] Appl. No.: 173,454

[22] Filed: Dec. 23, 1993

[51] Int. Cl.[6] .................................... H03L 7/085
[52] U.S. Cl. ...................... 331/1 A; 331/11; 331/14; 331/16; 331/17; 331/25; 331/44
[58] Field of Search .................... 331/1 A, 10, 11, 14, 331/16, 17, 25, 44

[56] References Cited

U.S. PATENT DOCUMENTS 4,847,569  7/1989  Dudziak et al. .................... 331/25
5,166,641  11/1992  Davis et al. ...................... 331/1 A Primary Examiner—Siegfried H. Grimm
Attorney, Agent, or Firm—Heslin & Rothenberg

[57] ABSTRACT

Calibration systems and techniques for phase-locked loops (PLLs) provide precise setting of the center frequency and/or uniform voltage controlled oscillator (VCO) gain characteristics. Center frequency is calibrated by imposing a selected center frequency at the output of the PLL and driving the control voltage $V_c$ across the PLL's filter to a predefined, steady state voltage indicative of PLL circuit calibration. The approach can be employed to calibrate any imposed VCO frequency output. VCO gain calibration is accomplished by employing the center frequency calibration technique only with a low frequency point imposed on the VCO output. A high frequency point on the transfer function is calibrated by applying a known voltage across the filter and driving the VCO output to a corresponding calibration frequency. Once a low frequency point and a high frequency point are calibrated, the slope of the VCO transfer function is defined. Various integrated PLL/calibration system embodiments are presented.

43 Claims, 4 Drawing Sheets

CALIBRATION SYSTEMS AND METHODS FOR SETTING PLL GAIN CHARACTERISTICS AND CENTER FREQUENCY

TECHNICAL FIELD

The present invention relates in general to phase-locked loops (PLLs), and more particularly, to automated, calibration systems and calibration techniques for PLLs which provide precise setting of center frequency and/or uniform gain characteristics.

BACKGROUND ART

As is well known, a phase-locked loop system produces an output signal which tracks an input signal in frequency and exhibits a fixed phase relationship to the input signal. As the input signal changes in frequency, the output signal likewise changes in such a manner as to maintain the phase relationship between the input and output signals. Originally, phase-locked loops were implemented using only analog techniques. These techniques continue in use today in many data processing and communications systems. An analog phase-locked loop typically consists of four fundamental parts; namely, a phase detector, a charge pump, a filter and a voltage controlled oscillator (VCO).

The phase detector is a device which detects the difference in phase between two input signals, and produces an output signal proportional to the amount of the phase difference. In a phase-locked loop the two inputs to the phase detector are the input to the phase-locked loop and the output signal of the VCO, i.e., the output of the phase-locked loop. The output signal from the phase detector is an analog up/down signal, the magnitude of which is representative of the amount of phase difference between the two input signals thereto, hereinafter referred to as an error signal. The charge pump produces a control voltage based on this error signal and outputs the control voltage to the filter, which is disposed at the input of the VCO. The filter serves to remove any high frequency components from the error signal produced by the charge pump and provides a slowly varying output signal which is representative of the average error in phase between the output signal and the input signal.

The voltage controlled oscillator is an analog oscillator which generates an output signal having a frequency corresponding to the slowly varying control signal across the filter. In one conventional embodiment, the voltage controlled oscillator comprises a voltage to current converter which is coupled through a summing node to an oscillator that provides the output signal from an input current. Often, a fixed bias current is also fed to the summing node. The fixed bias current operates to moderate the gain characteristics of the VCO.

Due to the feedback of the output signal to an input of the phase detector, the frequency of the voltage controlled oscillator is adjusted by the VCO input signal, i.e., the control signal across the filter, to maintain the fixed relationship between the input signal and output signal of the PLL.

Component tolerances and process variations often result in a wide range of possible center frequency settings at the VCO-output of an analog phase-locked loop system. Precise setting of a center frequency notwithstanding component tolerances of a PLL has traditionally been attempted by trimming the value of a resistor(s) within the VCO. This is a difficult and expensive operation, and still requires circuits which are very temperature stable and insensitive to power supply variations. The gain of a phase-locked loop can also vary significantly with process, temperature and power supply variations. Further, due to technology advances, PLLs are required to produce higher frequencies today while VCO transfer function tolerances become more critical and less achievable simultaneously.

As the density of digital circuitry increases, digital methods for controlling analog circuits become more feasible. The calibration systems and methods presented herein result in an analog PLL with, for example, a zero tolerance center frequency and/or minimal VCO gain deviation across the transfer function, which means a more practical and commercially viable PLL.

DISCLOSURE OF INVENTION

Briefly summarized, the invention comprises in a first aspect a calibration system for a phase-locked loop circuit having a phase comparator coupled through a charge pump, a filter, and a voltage to current converter, to a current controlled oscillator having a current input and a frequency output. The calibration system includes means for setting the frequency output of the current controlled oscillator to a selected frequency such that the current input to the current controlled oscillator receives a constant current $I_0$, wherein constant current $I_0$ comprises a summation of an output current $I_c$ from the voltage to current converter and a bias current $I_b$, the output current $I_c$ from the voltage to current converter being proportional to a control voltage $V_c$ across the filter. An adjustable bias current producing means is coupled between the filter and the current input to the current controlled oscillator for providing the bias current $I_b$ such that when the frequency output of the current controlled oscillator is set to the selected frequency, the control voltage $V_c$ across the filter is driven to a predefined, steady state voltage indicative of PLL circuit calibration.

In one preferred implementation, the selected frequency can comprise a center frequency within the range of frequencies potentially output from the current controlled oscillator such that when calibrated the predefined, steady state voltage comprises a center voltage within the range of possible control voltages when the PLL circuit is in stable operation. In another implementation, the calibration system can be integrated with the phase-locked loop circuit to allow for automated and repeated calibration of the circuit during time intervals when stable operation of the PLL is not required.

In a further aspect, the present invention comprises a method for calibrating a phase-locked loop circuit having a phase comparator coupled through a charge pump, a filter, and a voltage to current converter, to a current controlled oscillator having a current input $I_0$ and a frequency output $F_0$, the current input $I_0$ to the current controlled oscillator consisting of an output current $I_c$ from the voltage to current converter and a bias current $I_b$. The calibrating method includes the steps of: setting the frequency output $F_0$ of the current controlled oscillator to a selected frequency such that the current input $I_0$ to the current controlled oscillator is maintained constant; and monitoring a control voltage $V_c$ across the filter and automatically adjusting in response thereto the bias current $I_b$ such that the control voltage $V_c$ across the filter is driven to a predefined, steady state voltage indicative of PLL circuit calibration for the selected frequency. Thus, when the PLL circuit performs under stable operation, the frequency output $F_0$ of the current controlled oscillator equals the selected frequency whenever the control voltage $V_c$ across the filter equals the predefined, steady state voltage.

As still another aspect, an enhanced calibration system is presented for a phase-locked loop circuit such as that described above. In this system, a first means for calibrating the PLL circuit is provided. Calibration is accomplished with a selected first frequency $F_1$ applied to the frequency output $F_0$ of the current controlled oscillator such that a control voltage $V_c$ across the filter is driven to a predefined, steady state voltage $V_1$ indicative of PLL circuit calibration for the selected first frequency $F_1$. After calibrating a first point on the transfer function, second means for calibrating the PLL circuit proceeds to calibrate a second point along the transfer curve. This second calibration means calibrates the PLL circuit to a second frequency $F_2$ by disconnecting the charge pump and filter, setting the control voltage $V_c$ across the filter equal to a reference voltage $V_2$, and driving the frequency output $F_0$ of the current controlled oscillator to the second frequency $F_2$, the second frequency $F_2$ at the frequency output of the current controlled oscillator being indicative of PLL circuit calibration for the reference voltage $V_2$ set across the filter. The calibration points are chosen such that voltage $V_2$ is greater than voltage $V_1$ and frequency $F_2$ is greater than frequency $F_1$. By calibrating the phase-locked loop circuit at the first frequency $F_1$ and the second frequency $F_2$, the gain characteristics of the PLL are determined. In one embodiment, the calibration system can be integrated with the PLL circuit. In any embodiment, however, automated, and repeated gain calibration of the PLL circuit is possible, preferably during time intervals when stable operation of the PLL is not required.

In yet another aspect, a calibration method is presented again for the above-described phase-locked loop circuit. This calibration method allows the setting of two points on the PLL's transfer curve. The method includes the steps of: calibrating the PLL circuit at a selected first frequency $F_1$ applied to the frequency output $F_0$ of the current controlled oscillator such that the control voltage $V_c$ across the filter is driven to a predefined, steady state voltage $V_1$ indicative of PLL circuit calibration for the selected first frequency $F_1$; and also calibrating the PLL circuit to a second frequency $F_2$ by disconnecting the charge pump and filter, setting the control voltage $V_c$ across the filter equal to a reference voltage $V_2$ and driving the frequency output $F_0$ of the current controlled oscillator to the second frequency $F_2$. The second frequency $F_2$ at the frequency output of the current controlled oscillator is indicative of PLL circuit calibration for the reference voltage $V_2$ imposed across the filter. In this method, it is assumed that voltage $V_2$ is greater than voltage $V_1$ and frequency $F_2$ is greater than frequency $F_1$. By calibrating the phase-locked loop circuit at the first frequency $F_1$ and the second frequency $F_2$, gain characteristics of the linear responding PLL are calibrated. Further details of the calibrating systems and methods of the invention are described below.

To restate, various calibration systems and methods are presented for setting PLL gain characteristics and center frequency. The approaches set forth eliminate frequency variations as a function of temperature and power supply voltages, as well as due to PLL component tolerances. Automated, repeated calibration of the PLL circuit is anticipated using the integrated digital circuits described. Exact calibration of the center frequency and/or setting of the transfer function is possible. An optimal voltage-frequency point is preferably maintained by repeated calibration of the PLL to a centered, steady state value.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which.

BEST MODE FOR CARRYING OUT THE INVENTION

Figure 1:
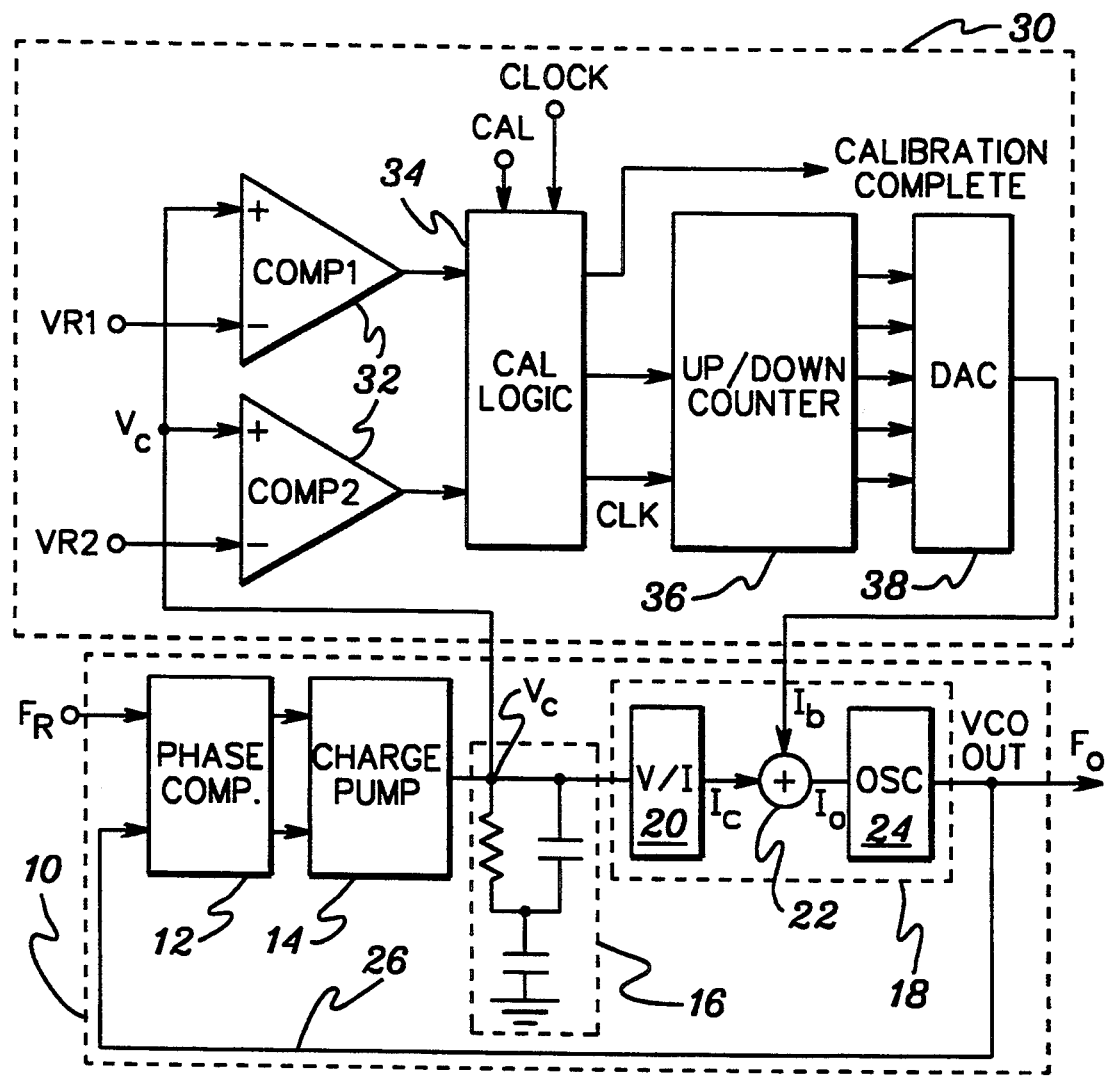
FIG. 1 is a schematic of one embodiment of a phase-locked loop system and integral calibration system in accordance with the invention.
Figure 2:
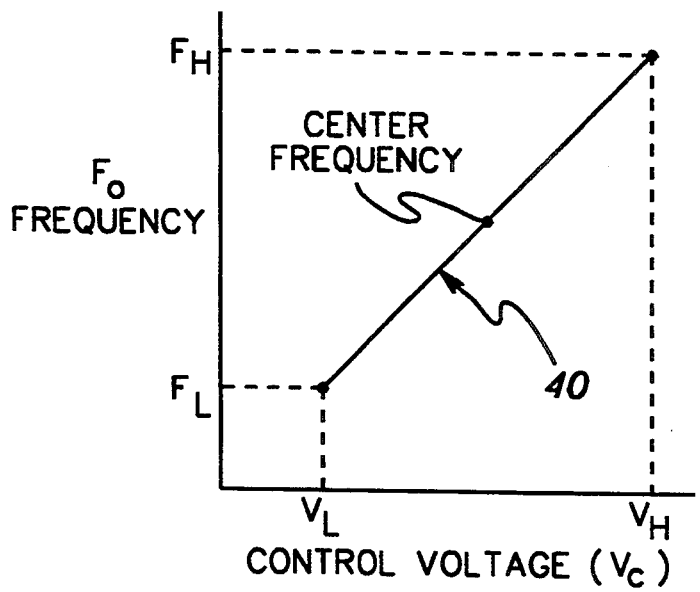
FIG. 2 is a graph of a sample transfer function for a VCO employed by the PLL systems of FIGS. 1 & 4.

FIG. 1 depicts one embodiment of an integrated phase-locked loop 10 and calibration system 30 pursuant to the invention. System 30 provides an automated approach to calibrating a desired control or filter voltage $V_c$ to a fixed VCO output frequency $F_0$. A sample transfer function for a voltage controlled oscillator 18 such as that employed by PLL 10 is shown in FIG. 2. An important calibration point has traditionally comprised a center frequency $F_c$, which is the value of the output frequency $F_0$ when the control voltage $V_c$ at the input to the VCO is centered within its range. Although the concepts presented herein apply to the setting of any output frequency $F_0$ and control voltage $V_c$ point along the PLL's transfer curve, the circuitry and processes of this first aspect of the invention are described with reference to correlating the center frequency $F_c$ to a control voltage $V_c$ near the center of its dynamic range.

Continuing with FIG. 1, PLL 10 includes a phase comparator 12 which is coupled through a charge pump 14, a filter 16, and a voltage to current converter 20, to a current controlled oscillator 24, which has a current input $I_0$ and a frequency output $F_0$. A summing node 22 is disposed between voltage to current converter 20 and oscillator 24. Together, converter 20 and oscillator 24 comprise voltage controlled oscillator 18. The voltage across filter 16, referred to herein as the control voltage $V_c$, comprises the input signal to voltage controlled oscillator 18.

A feedback line 26 provides output signal $F_0$ to one of two inputs of phase comparator 12 so that PLL 10 comprises a closed loop circuit. The other comparator input receives a reference frequency signal $F_R$. If desired, a feedback divider (not shown) could be interposed along line 26 from the output of VCO 18 to the one input of phase comparator 12. Without such a divider, the oscillator's output frequency $F_0$ will mirror the received reference frequency $F_R$. Calibration system 30 is integrated with PLL 10 to monitor the control voltage $V_c$ across filter 16, and provide an adjustable bias current $I_b$ back to summing node 22 within VCO 18. System 30 includes two comparators 32 whose outputs control a calibration logic circuit 34 and hence the stepping of, for example, an up/down counter 36. Alternate counting mechanisms might include the use of registers, adder/subtractors or microprocessors, all of which should be considered equivalent to an up/down counter for purposes of this invention. The setting of counter 36 drives a digital to analog converter 38 which actually provides bias current $I_b$ to VCO 18.

System 30 coupled to, and preferably integrated with, PLL 10 allows the phase-locked loop to be periodically, automatically adjusted to account, for example, for component tolerances as well as variations in PLL performance due to temperature and/or power supply changes. As noted, by employing the integrated calibration system, the center frequency oscillation can be calibrated to a centered control voltage. Referring to the transfer function of FIG. 2, the center frequency of the VCO is defined as the frequency of operation where the control voltage $V_c$, measured at the filter node (i.e., the input to the VCO), is at the center of its operating range, which is assumed to be known. For example, if the voltage control's range is 0.5 V–2.5 V, the center control voltage would comprise 1.5 V. The calibration adjustment can be done during any time period when stable operation of the PLL is not required. For example, during a vertical retrace in a video system or immediately prior to a reset in a disk storage system.

During center frequency calibration, comparators COMP1 and COMP2 each receive at a positive (+) input the present control voltage $V_c$ for comparison with a respective first and second reference voltage VR1 and VR2. For center frequency calibration, reference voltages VR1 and VR2 are preferably chosen near the center of the control voltage range, but with values which differ by a small amount such that a center control voltage $V_c$ is bracketed. For example, if the center of the control voltage range is 1.5 volts, then a lower reference voltage VR1 might be 1.475 volts and an upper reference voltage VR2 might be 1.525 volts. The range of values between the first and second reference voltages VR1 and VR2 defines the tolerance with which the control voltage $V_c$ is set given an imposed frequency at the PLL output. If a frequency other than the center frequency is set at the output, then reference voltages VR1 and VR2 would be chosen to bracket the anticipated or desired control voltage $V_c$ with reference to the VCO transfer function.

Calibration logic 34, coupled to the output of comparators 32, deduces from the comparator outputs whether control voltage $V_c$ is above or below the reference settings, VR1, VR2, or between them. Calibration logic 34 can be readily implemented by one of ordinary skill in the art using existing logic functions. This logic 34 is driven by an electrical calibration enable signal 'CAL' and a calibration clock signal 'CLOCK' received from the associated control system (not shown) which may either be on-chip or external to the chip containing the phase-locked loop. Provision of these signals starts the calibration process.

If $V_c < VR1$ then logic 34 steps up/down counter 36 down so that a smaller bias current $I_b$ is provided to summing node 22. This in turn causes the PLL to adjust by increasing the control voltage across the filter to provide the extra current needed to drive oscillator 24 at the selected output frequency $F_0$. The assumption here is that a fixed frequency is imposed on the VCO output such that the input current $I_0$ to oscillator 24 is constant, with current $I_0$ consisting of a summation of the converter current $I_c$ and the bias current $I_b$.

When control voltage $V_c$ is greater than reference voltage VR2, then logic 34 steps counter 36 up, which increases the bias current provided to summing node 22 and drops the output current $I_c$ from V/I converter 20 and hence the control voltage across filter 16. If control voltage $V_c$ is between reference voltage VR1 and reference voltage VR2, then the calibration logic preferably outputs a "calibration complete" signal. Although five bits are shown interconnecting counter 36 and digital to analog converter 38, the size of the counter may vary depending on the particular application.

As noted, the calibration logic requires two logical inputs, namely, a calibration command 'CAL' and a 'CLOCK' to determine how often to step the counter. The calibration clock's frequency is related to the filter design and must be slow enough to allow the control voltage $V_c$ to settle to a near final value in a single calibration cycle. The reference frequency $F_R$ applied to the PLL input during the calibration process must also be stable. By way of example, the calibration clock frequency might be $1/50^{th}$ that of the stable reference frequency $F_R$. This would allow sufficient time for the PLL to lock between counter transitions. As an alternative to actively providing the "calibration complete" signal, a set amount of time may be preallowed for each calibration operation, subsequent to which an assumption is made that calibration is complete.

Figure 3:
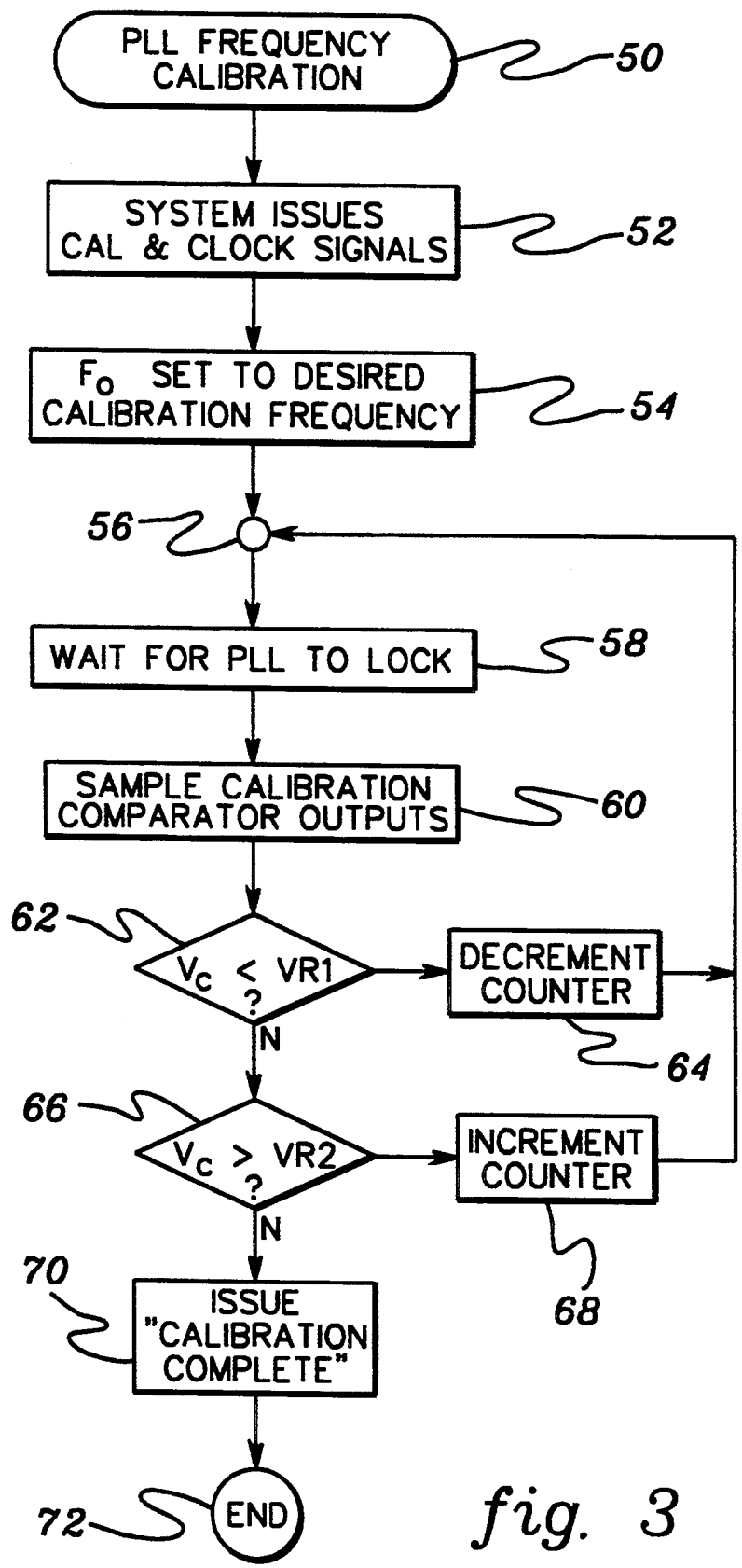
FIG. 3 is a flowchart of one embodiment of a PLL calibration technique in accordance with of the invention.

One embodiment of a calibration procedure in accordance with this aspect of the invention is depicted in FIG. 3. This procedure assumes the existence of the integrated circuitry of FIG. 1. The object of the calibration is to set the control voltage $V_c$ to a predetermined point in its known range, such as a center point, relative to a selected output frequency $F_0$, e.g., a center frequency imposed at VCO OUT.

Processing begins, 50 "PLL Frequency Calibration," when system control issues the calibration enable signal 'CAL' and the calibration clock, 52 "System issues CAL & CLOCK Signals." The voltage controlled oscillator output $F_0$ is then set to a desired calibration frequency, 54 "$F_0$ Set To Desired Calibration Frequency," and an interval of time is allowed to pass to allow the phase-locked loop to reach steady state with the selected frequency imposed at the output, 58 "Wait For PLL To Lock." Typically, the PLL locks within a portion of the period of the calibration clock 'CLOCK' employed by calibration system 30 (FIG. 1). The outputs of the calibration comparators 32 are sampled by the calibration logic, 60 "Sample Calibration Comparator Outputs," and if the control voltage $V_c$ is less than the lower reference voltage VR1, 62 "$V_c < VR1$?," then the counter is decremented to decrease the bias current $I_b$, 64 "Decrement Counter." After modifying the counter, return is made to junction 56 and hence instruction 58 where calibration processing waits for the PLL to lock subsequent to the bias current $I_b$ modification.

If control voltage $V_c$ is greater than lower reference voltage VR1, then processing determines whether the control voltage is also greater than second reference voltage VR2, 66 "$V_c$>VR2?" If "Yes," then the counter is stepped up, 68 "Increment Counter," which increases the bias current $I_b$ to the summing node, after which processing returns to junction 56. If the control voltage is neither below reference voltage VR1 nor above reference voltage VR2, then the control voltage falls within the desired range, i.e., VR1<$V_c$<VR2, and calibration is complete, 70 "Issue Calibration Complete." This terminates calibration processing, 72 "End."

It is significant to note from FIGS. 1 & 3 and the above description that the present invention preferably comprises an "automated" technique for periodically adjusting calibration of the PLL at one or more points along the VCO transfer function. Manual assistance is not required to implement the calibration process; rather, repeated on-line calibration is feasible.

Automated gain calibration system and method embodiments are next described with reference to the circuit diagram of FIG. 4 and process flowchart of FIG. 5. This gain calibration approach, which employs in part the calibration technique of FIGS. 1 & 3, provides the ability to precisely set the VCO transfer function.

Figure 4:
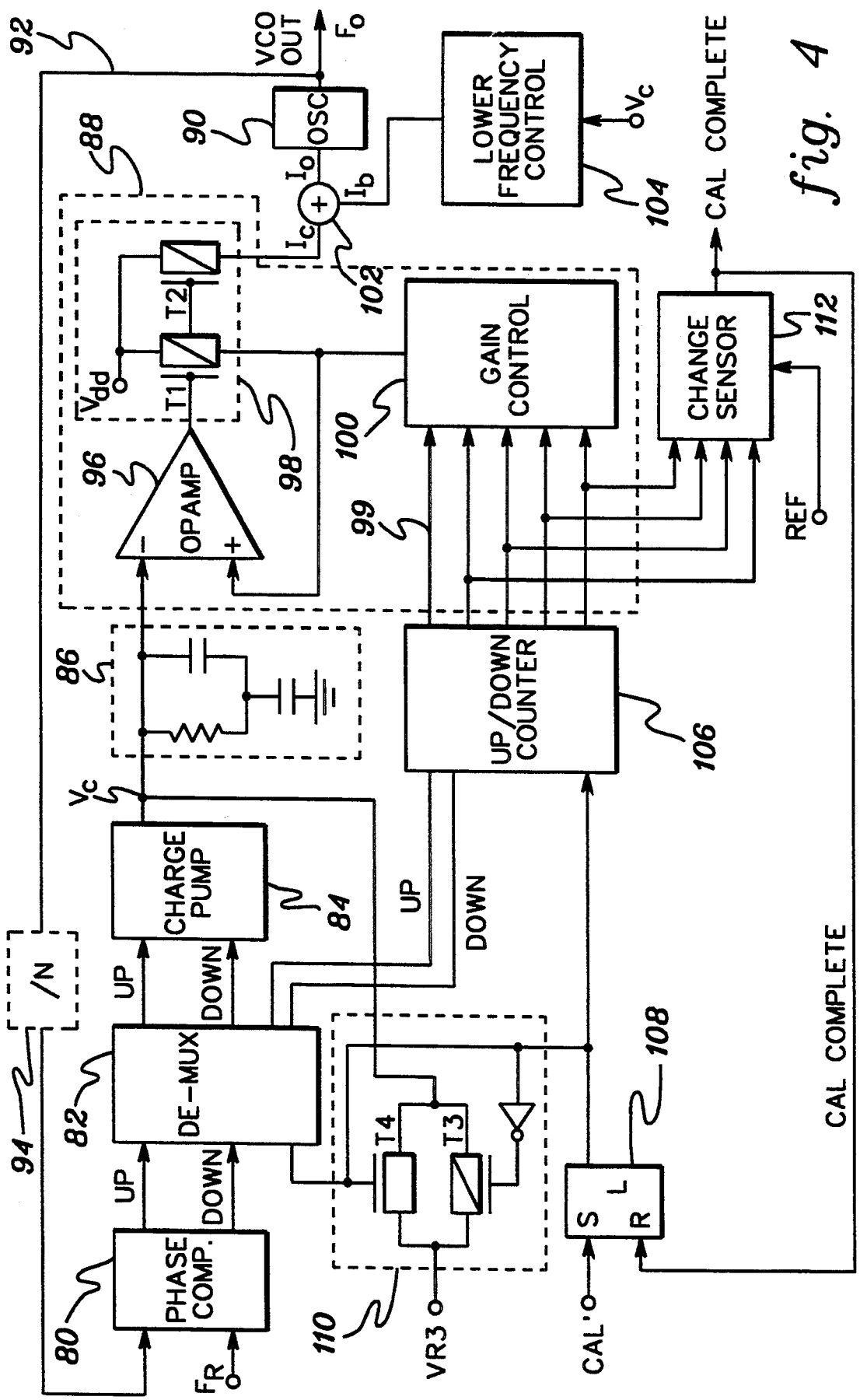
FIG. 4 is a schematic of another embodiment of a phase-locked loop system and integral calibration system in accordance with the invention.

Referring to FIG. 4, an integrated PLL/calibration system pursuant to this embodiment of the invention is shown to comprise a phase comparator 80, a demultiplexer 82, a charge pump 84, a filter 86, a voltage to current converter 88 and an oscillator 90. A reference frequency $F_R$ is provided at one input to the dual input phase comparator 80 and the frequency output $F_0$ is provided at the other input to comparator 80 via closed loop feedback line 92. Oscillator 90 receives an input current $I_0$ from a summing node 102 disposed between voltage to current converter 88 and oscillator 90. Input current $I_0$ consists of an output current $I_c$ from voltage to current converter 88 and a bias current $I_b$ from a low frequency control 104. Both converter 88 and control 104 receive as input the control voltage $V_c$ across filter 86. Control circuit 104 is substantially identical to the calibration system 30 of FIG. 1. As described further below, however, circuit 104 is preferably employed in this embodiment to calibrate a low frequency point at one end of the VCO transfer function (FIG. 2).

In the circuit of FIG. 4, voltage to current converter 88 is shown to include an op amp 96, a current mirror 98 connected at its output and a gain control 100. Op amp 96 is configured as a voltage follower circuit such that the voltage across gain control 100 is substantially equal to control voltage $V_c$ across filter 86. Gain control 100 includes an array of resistors (not shown) and provides a current substantially equal to the control voltage $V_c$ divided by the resistance of a selected resistor path through the array of resistors.

Current mirror 98 includes complementary metal oxide semiconductor (CMOS) circuits with P-channel field-effect transistors (PFETs) T1 & T2 indicated in the drawing by a rectangle with a diagonal line formed therein and a control element or gate electrode arranged adjacent thereto. An N-channel field-effect transistor (NFET) T4 is indicated in FIG. 4 by a rectangle without a diagonal line and with a control element or gate electrode arranged adjacent thereto.

PFETs T1 and T2 of current mirror 98 have common gate and source connections. The drain of PFET T1 is fed by gain control 100 while the drain of PFET T2 is coupled to summing node 102. Thus, the current output from gain control 100 is mirrored to summing node 102 as converter current $I_c$. The resistance of gain control 100 is chosen by an up/down counter 106 which in calibration mode is set by up/down error signals passed through demultiplexer 82 from phase comparator 80. In particular, up/down counter 106 is stepped whenever the counter receives an up pulse or a down pulse, even if the pulses are received simultaneously.

Gain calibration is activated when a CAL' signal is sent from the controlling system to a set 'S' input to a set-reset latch 'L' 108. Latch 108 provides an enabling signal simultaneously to counter 106 and demultiplexer 82, which initiates transfer of the up/down signals of phase comparator 80 from the PLL's charge pump to the up/down counter, thus effectively isolating charge pump 84. Simultaneous with enabling of gain calibration, a fixed reference voltage VR3 is imposed across filter 86 as the control voltage $V_c$. When enabled, an analog switch circuit 110, comprising a PFET T3 and NFET T4 connected as shown, serves to switch control voltage $V_c$ to reference voltage VR3.

A calibration complete signal "CAL complete" is generated by a change sensor 112 connected to sample, by way of example, the upper bits from up/down counter 106. Thus, when all but a least significant bit 99 from counter 106 remain steady for a selected number of 'REF' cycles, the "CAL complete" signal is preferably issued and returned to a reset 'R' input of latch 108, which terminates calibration processing. As with the first embodiment, the use of up/down counter 106 is merely exemplary of a counting mechanism. Equivalent hardware/software could alternatively be used.

Gain calibration proceeds by first calibrating a low frequency point of the transfer function. This is accomplished by the low frequency control 104, which again is nearly identical to system 30 described above in connection with FIGS. 1 & 3. Calibrating the low frequency point is assumed to have no effect on the circuit's loop gain. A high frequency signal is then calibrated using the gain control circuit of FIG. 4 and processing described below. Calibration of the high frequency point similarly has no effect on the low frequency set point. Together, the two calibrated points define the slope of the transfer function for the PLL's voltage controlled oscillator, i.e., the PLL's gain characteristics.

Figure 5:
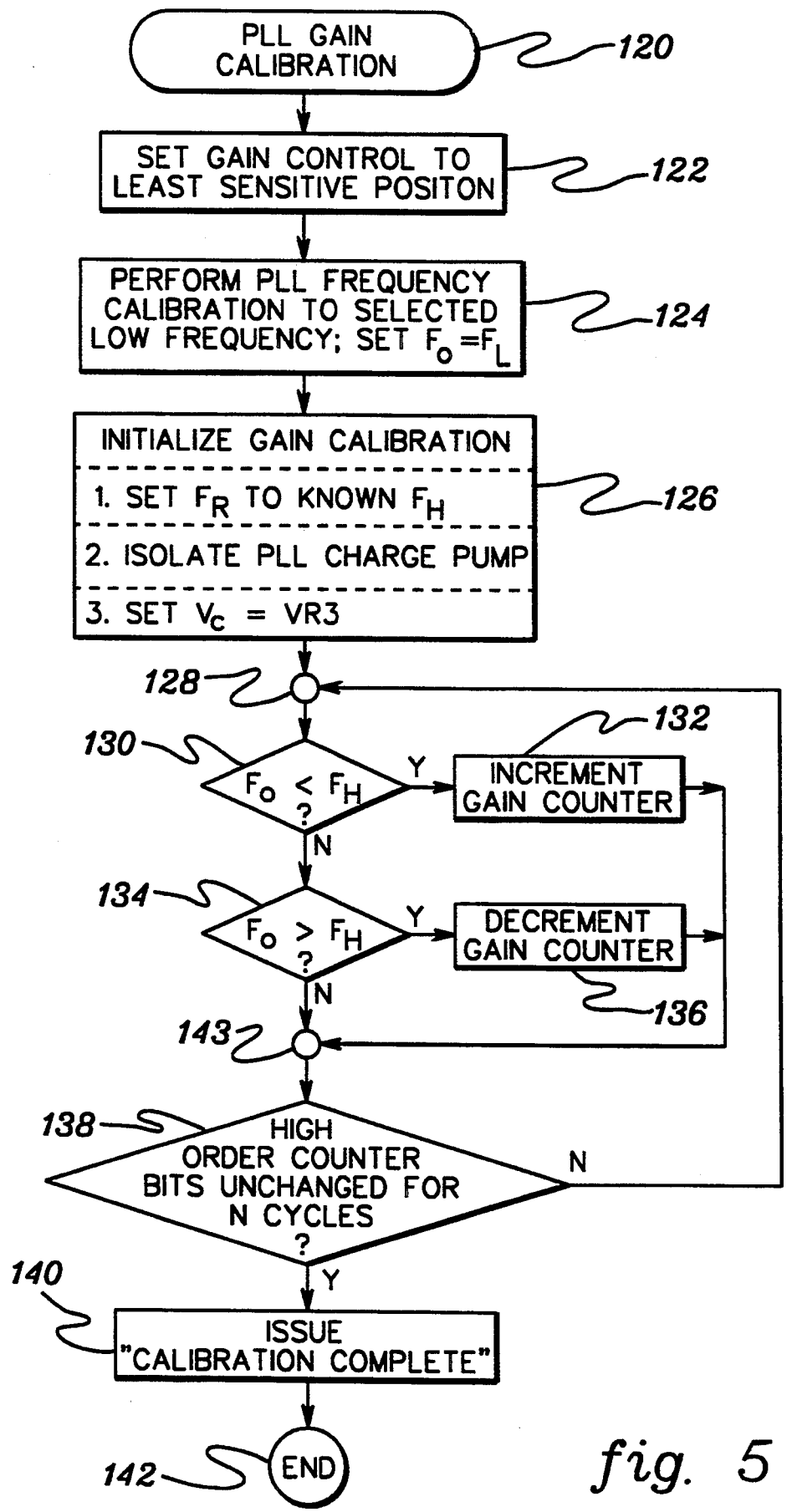
FIG. 5 is a flowchart of one embodiment of a PLL gain calibration technique in accordance with the invention.

Referring to FIG. 5, gain calibration begins, 120 "PLL Gain Calibration," with the setting of gain control 100 to its least sensitive position, i.e., highest impedance, 122 "Set Gain Control To Least Sensitive Position." This can be accomplished by setting the up/down counter to a preselected value. By setting the gain control as high as possible, the current fed into summing node 102 from voltage to current converter 88 is minimized. Frequency calibration is then performed at a selected low frequency using circuit 104, i.e., the calibration circuitry of FIG. 1, 124 "Perform PLL Frequency Calibration To Selected Low Frequency; Set $F_0=F_L$." This entails setting the output signal to a known low frequency and driving the control voltage $V_c$ to its corresponding value defined between appropriate VR1, VR2 reference points such that the bias current $I_b$ is set.

With bias current $I_b$ established, the upper frequency of the range of output frequencies is then calibrated, 126 "Initialize Gain Calibration; Set $F_R$ To Known $F_H$; isolate PLL Charge Pump; Set $V_c$ Equal To VR3." Calibration proceeds by determining whether the output frequency $F_0$ is less than a desired high frequency $F_H$, 130 "$F_0<F_H$?" If "Yes," then up/down counter 106 is stepped up, 132 "Increment Gain Counter." Thereafter, processing continues to junction 143.

If the output frequency $F_0$ is not less than the desired high frequency $F_H$, then processing determines whether the output frequency is greater than the this high frequency, 134 "$F_0>F_H$?" If "Yes," then the up/down counter is decremented, 136 "Decrement Gain Counter," and processing continues to junction 143. If the output frequency is neither less than the desired high frequency nor greater than this high frequency, processing passes through junction 143 to consider whether the counter's high order bits have remained unchanged for a selected number of reference clock cycles, 138 "High Order Counter Bits Unchanged For n Cycles?" If "No," processing returns to junction 128. Otherwise, a calibration complete signal is issued, 140 "Issue Gain Calibration Complete, " and processing terminates, 142 "End."

Those skilled in the art will note from the above discussion that the present invention encompasses various calibration systems and methods for setting PLL gain characteristics and center frequency. The approaches presented eliminate frequency variations as a function of temperature and power supply voltages, as well as due to component tolerances, so that exact calibration of the center frequency and/or setting of the transfer function is possible. Automated, repeated calibration of the PLL circuit is anticipated using the integrated, digital circuits described. An optimal voltage-frequency point is attained by the repeated calibration of the PLL to a center, steady state frequency.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. For example, as used in the claims a "phase-locked loop (PLL) circuit" should be read to mean a calibrated delay line, a clock (duty cycle) restoring circuit, or a more traditional phase aligning PLL circuit, etc. The following claims are intended to encompass all such modifications.

We claim:

1. A calibration system for a phase-locked loop (PLL) circuit having a phase comparator coupled through a charge pump, a filter, and a voltage to current converter, to a current controlled oscillator having a current input and a frequency output, said calibration system comprising:

means for setting the frequency output of the current controlled oscillator to a selected frequency such that the current input to the current controlled oscillator receives a constant current $I_0$, wherein constant current $I_c$ comprises a summation of a counter current $I_c$ from the voltage to current converter and a bias current $I_b$, the output current $I_c$ from the voltage to current converter being proportional to a control voltage $V_c$ across the filter; and adjustable means, coupled between the filter and the current input to the current controlled oscillator, for providing said bias current $I_b$ to the current input of the current controlled oscillator such that when the frequency output of the current controlled oscillator is set to the selected frequency, the control voltage across the filter is driven to a predefined, steady state voltage indicative of PLL circuit calibration, and wherein when said PLL circuit performs under stable operation, the frequency output of the current controlled oscillator will equal the selected frequency when the control voltage across the filter equals the predefined, steady state voltage.

2. The calibration system of claim 1, wherein said adjustable means for providing said bias current $I_b$ includes a first comparator and a second comparator, said first comparator being connected to compare the control voltage $V_c$ with a first reference voltage VR1, and said second comparator being connected to compare the control voltage $V_c$ with a second reference voltage VR2, wherein VR2>VR1 and said first and second reference voltages are selected such that a range of voltages is defined thereby, the range of voltages encompassing the predefined, steady state voltage appearing across the filter when the frequency output $F_0$ of the current controlled oscillator equals the selected frequency.

3. The calibration system of claim 2, wherein said adjustable means for providing said bias current $I_b$ further includes:

calibration logic coupled to receive outputs from the first comparator and second comparator and generate based thereon one of an up signal and a down signal, the up signal being generated when control voltage $V_c$ is greater than second reference voltage VR2, and the down signal being generated when control voltage $V_c$ is less than the first reference voltage VR1;

an up/down counter coupled to receive the up and down signals generated by the calibration logic, said up/down counter having a setting and stepping the setting up with receipt of the up signal and down with receipt of the down signal; and a digital to analog converter coupled to the up/down counter for outputting the bias current $I_b$ based on the setting of the up/down counter.

4. The calibration system of claim 3, wherein said calibration logic further includes means for signaling completion of calibration when control voltage $V_c$ is between the first reference voltage VR1 and the second reference voltage VR2.

5. The calibration system of claim 1, further comprising electrical means for periodically initiating calibration of the phase-locked loop circuit.

6. The calibration system of claim 1, wherein the selected frequency comprises a center frequency and the predefined, steady state voltage indicative of PLL circuit calibration comprises a center voltage within a range of possible control voltages during stable operation of the PLL circuit.

7. The calibration system of claim 1, wherein said means for setting the frequency output includes an electrical feedback loop from the frequency output of the current controlled oscillator to a reference input of the phase comparator such that the selected frequency comprises an input reference frequency.

8. An integrated phase-locked loop (PLL) and calibration system comprising:

a phase detector means for comparing the phases of an output signal of the PLL and a reference input signal to produce an error signal representative of any phase difference;

an amplifier/filter coupled to receive the error signal and produce therefrom a voltage control signal $V_c$;

a voltage to current converter coupled to the amplifier/filter to receive at an input the voltage control signal $V_c$ and generate therefrom a converter current $I_c$;

a current controlled oscillator having a current input $I_0$ and a frequency output $F_0$, the frequency output $F_0$ of the current controlled oscillator comprising the output signal of the PLL and being proportional to the current input $I_0$;

means for providing a bias current $I_b$ to the current controlled oscillator, wherein the current input $I_0$ comprises a summation of the converter current $I_c$ and the bias current $I_b$; and calibration means, coupled between the amplifier/filter and the current input to the current controlled oscillator, for calibrating the control voltage $V_c$ and frequency output $F_0$, wherein when said frequency output $F_0$ of the current controlled oscillator is set to a selected frequency, said calibration means is capable of driving the control voltage $V_c$ to a predefined, steady state voltage indicative of PLL circuit calibration for said selected frequency at the frequency output $F_0$ of the current controlled oscillator.

9. The integrated PLL and calibration system of claim 8, wherein said calibration means includes a first comparator and a second comparator, said first comparator being connected to compare control voltage $V_c$ with a first reference voltage VR1, and said second comparator being connected to compare control voltage $V_c$ with a second reference voltage VR2, wherein VR2>VR1 and said first and second reference voltages are selected such that a range of voltages is defined thereby, the range of voltages encompassing the predefined, steady state voltage appearing across the amplifier/filter when the frequency output $F_0$ of the current controlled oscillator equals the selected frequency and the PLL circuit is calibrated.

10. The integrated PLL and calibration system of claim 9, wherein said calibration means further includes:

calibration logic coupled to receive outputs from the first comparator and second comparator and generate based thereon one of an up signal and a down signal, the up signal being generated when control voltage $V_c$ is greater than second reference voltage VR2, and the down signal being generated when control voltage $V_c$ is less than first reference voltage VR1; and an up/down counter coupled to receive the up and down signals generated by the calibration logic, the up/down counter having a setting and stepping the setting up with receipt of the up signal and down with receipt of the down signal.

11. The integrated PLL and calibration system of claim 10, wherein said means for providing the bias current $I_b$ comprises a digital to analog converter coupled to the up/down counter for outputting the bias current $I_b$ based on the setting of the up/down counter.

12. The integrated PLL and calibration system of claim 11, wherein said calibration logic of said calibration means includes means for signaling completion of calibration when control voltage $V_c$ is between first reference voltage VR1 and second reference voltage VR2.

13. The integrated PLL and calibration system of claim 8, wherein said calibration means includes means for calibrating the control voltage $V_c$ at a predefined, steady state center voltage indicative of PLL circuit calibration for a center frequency set at the frequency output $F_0$ of the current controlled oscillator.

14. The integrated PLL and calibration system of claim 8, wherein said calibration means includes electrical signaling means for periodically driving the control voltage $V_c$ to the predefined, steady state voltage indicative of PLL circuit calibration for the selected frequency at the frequency output $F_0$ of the current controlled oscillator.

15. A method for calibrating a phase-locked loop (PLL) circuit having a phase comparator coupled through a charge pump, a filter, and a voltage to current converter, to a current controlled oscillator having a current input $I_0$ and a frequency output $F_0$, the current input $I_0$ to the current controlled oscillator consisting of a converter current $I_c$ from the voltage to current converter and a bias current $I_b$, said calibrating method comprising the steps of:

(a) setting the frequency output $F_0$ of the current controlled oscillator to a selected frequency such that the current input $I_0$ to the current controlled oscillator is maintained constant; and (b) monitoring a control voltage $V_c$ across the filter and automatically adjusting in response thereto the bias current $I_b$ such that the control voltage $V_c$ across the filter is driven to a predefined, steady state voltage indicative of PLL circuit calibration for the selected frequency, whereby when said PLL circuit is in stable operation, the frequency output $F_0$ of the current controlled oscillator equals the selected frequency whenever the control voltage $V_c$ across the filter equals the predefined, steady state voltage.

16. The calibrating method of claim 15, wherein said step (b) includes comparing control voltage $V_c$ against a first reference voltage VR1 and against a second reference voltage VR2, wherein when the control voltage $V_c$ is between first reference voltage VR1 and second reference voltage VR2, the control voltage is determined to have said predefined, steady state voltage indicative of PLL circuit calibration.

17. The calibrating method of claim 16, wherein said step (b) further includes lowering the bias current $I_b$ when the control voltage $V_c$ is less than the first reference voltage VR1, and raising the bias current $I_b$ when the control voltage is greater than the second reference voltage VR2.

18. The calibrating method of claim 15, wherein the selected frequency comprises a center frequency and the predefined, steady state voltage comprises a center voltage within a range of possible voltages for voltage control $V_c$ when the PLL circuit is in stable operation.

19. The calibrating method of claim 15, further comprising the step of automatically repeating steps (a) & (b) periodically such that accurate calibration of the PLL circuit is maintained.

20. The calibrating method of claim 15, further comprising the step of signaling completion of calibration once the control voltage $V_c$ across the filter is driven to the predefined, steady state voltage indicative of PLL circuit calibration for the selected frequency.

21. A calibration system for a phase-locked loop (PLL) circuit having a phase comparator coupled through a charge pump, a filter, and a voltage to current converter, to a current controlled oscillator having a current input $I_0$ and a frequency output $F_0$, the current input $I_0$ comprising a summation of a converter current $I_c$ from the voltage to current converter and a bias current $I_b$, said calibration system comprising:

first means for calibrating the PLL circuit with a selected first frequency $F_1$ applied to the frequency output $F_0$ of the current controlled oscillator such that a control voltage $V_c$ across the filter is driven to a predefined, steady state voltage $V_1$ indicative of PLL circuit calibration for the selected first frequency $F_1$; and second means for calibrating the PLL circuit to a second frequency $F_2$ by disconnecting the charge pump and filter, setting the control voltage $V_c$ across the filter equal to a reference voltage $V_2$ and driving the frequency output $F_0$ of the current controlled oscillator to the second frequency $F_2$, said second frequency $F_2$ at the frequency output of the current controlled oscillator being indicative of PLL circuit calibration for the reference voltage $V_2$ set across the filter, wherein $V_2 > V_1$, and $F_2 > F_1$, and by calibrating the phase-locked loop circuit at the first frequency $F_1$ and the second frequency $F_2$, gain characteristics of the PLL are calibrated.

22. The calibration system of claim 21, wherein the selected first frequency $F_1$ of the first means for calibrating comprises a low frequency $F_L$ applied to the frequency output $F_0$ and the control voltage $V_c$ across the filter is driven to a predefined, steady state low voltage $V_L$, and wherein the second frequency $F_2$ of the second means for calibrating comprises a high frequency $F_H$ and the reference voltage $V_2$ comprises a high voltage $V_H$, and wherein frequencies $F_L$ and $F_H$ define a range of possible PLL frequency outputs and voltages $V_L$ and $V_H$ define a range of possible control voltages.

23. The calibration system of claim 21, wherein said first means for calibrating includes a first comparator and a second comparator, said first comparator being connected to compare the control voltage $V_c$ with a first reference voltage VR1, and said second comparator being connected to compare the control voltage $V_c$ with a second reference voltage VR2, wherein VR2 > VR1 and the first and second reference voltages are selected such that a small range of voltages is defined thereby, the small range of voltages encompassing the predefined, steady state voltage $V_1$ indicative of PLL circuit calibration for the selected first frequency $F_1$.

24. The calibration system of claim 23, wherein said first means for calibrating further includes:

calibration logic coupled to receive outputs from the first comparator and the second comparator and generate based thereon one of an up signal and a down signal, the up signal being generated when control voltage $V_c$ is greater than second reference voltage VR2, and the down signal being generated when control voltage $V_c$ is less than the first reference voltage VR1;

a first up/down counter coupled to receive the up and down signals generated by the calibration logic, said first up/down counter having a setting and stepping the setting up with receipt of the up signal and down with receipt of the down signal; and a digital to analog converter coupled to the first up/down counter for outputting the bias current $I_b$ based on the setting of the first up/down counter.

25. The calibration system of claim 24, wherein said calibration logic further includes means for signaling completion of calibration based on the selected first frequency $F_1$ when control voltage $V_c$ is between the first reference voltage VR1 and the second reference voltage VR2.

26. The calibration system of claim 21, wherein said second means for calibrating the PLL circuit includes:

a demultiplexer connected between the phase comparator and the charge pump and having a control input for receiving a calibration control signal, the demultiplexer including means for discontinuing transfer of error signals from the phase comparator to the charge pump;

a second up/down counter connected to receive through the demultiplexer the error signal from the phase comparator when the charge pump discontinues receiving the error signal from the phase comparator, said second up/down counter having a setting which is stepped up with receipt of an up error signal from the phase comparator and down with receipt of a down error signal from the phase comparator;

wherein the voltage to current converter includes a gain control circuit having an array of resistors connected to an output of the second up/down counter, said gain control circuit including means for selecting a resistor path within the array of resistors based upon the setting of the second up/down counter; and means for reflecting the control voltage $V_c$ across the filter to the output of the gain control circuit such that the converter current $I_c$ output from the voltage to current converter is equivalent to the control voltage $V_c$ divided by the resistance of the selected resistor path through the gain control circuit.

27. The calibration system of claim 26, further comprising means for signaling completion of calibration based on the frequency output $F_0$ approximately equaling the second frequency $F_2$.

28. The calibration system of claim 27, wherein said means for signaling completion of calibration includes a change sensor connected to monitor at least some output bits of the second up/down counter, said change sensor including means for outputting a calibration complete signal whenever there is no change in the monitored bits from the second up/down counter over a selected number of cycles of a reference clock.

29. The calibration system of claim 26, wherein the second means for calibrating includes an analog switch connected between reference voltage $V_2$ and the control voltage $V_c$ across the filter, said analog switch being activated simultaneously with switching of the demultiplexer such that upon disconnecting the charge pump from receiving the error signal output from the phase comparator the reference voltage $V_2$ is applied across the filter.

30. An integrated phase-locked loop (PLL) and calibration system comprising:

a phase detector means for comparing the phases of an output signal of the PLL and a reference input signal to produce an error signal representative of any phase difference;

an amplifier/filter coupled to receive the error signal and produce therefrom a voltage control signal $V_c$;

a voltage to current converter coupled to the amplifier/filter to receive at an input the voltage control signal $V_c$ and generate therefrom a converter current $I_c$;

a current controlled oscillator having a current input $I_0$ and a frequency output $F_0$, the frequency output $F_0$ of the current controlled oscillator comprising the output signal of the PLL and being proportional to the current input $I_0$;

means for providing a bias current $I_b$ to the current controlled oscillator, wherein the current input $I_0$ comprises a summation of the converter current $I_c$ and the bias current $I_b$;

first means for calibrating the PLL circuit with a selected first frequency $F_1$ applied to the frequency output $F_0$ of the current controlled oscillator such that the control voltage $V_c$ across the filter is driven to a predefined, steady state voltage $V_1$ indicative of PLL circuit calibration for the selected first frequency $F_1$; and second means for calibrating the PLL circuit to a second frequency $F_2$ by disconnecting the charge pump and filter, setting the control voltage $V_c$ across the filter equal to a reference voltage $V_2$ and driving the frequency output $F_0$ of the current controlled oscillator to the second frequency $F_2$, said second frequency $F_2$ at the frequency output of the current controlled oscillator being indicative of PLL circuit calibration for the reference voltage $V_2$ set across the filter, wherein $V_c > V_1$ and $F_2 > F_1$, and by calibrating the phase-locked loop circuit at the first frequency $F_R$ and the second frequency $F_2$, gain characteristics of the PLL are calibrated.

31. The calibration system of claim 30, wherein the selected first frequency $F_1$ of the first means for calibrating comprises a low frequency $F_L$ applied to the frequency output $F_0$ and the control voltage $V_c$ across the filter is driven to a predefined, steady state low voltage $V_L$, and wherein the second frequency $F_2$ of the second means for calibrating comprises a high frequency $F_H$ and the reference voltage $V_c$ comprises a high voltage $V_H$, and wherein frequencies $F_L$ and $F_H$ define a range of possible PLL frequency outputs and voltages $V_n$ and $V_H$ define a range of possible control voltages.

32. The calibration system of claim 30, wherein said first means for calibrating includes a first comparator and a second comparator, said first comparator being connected to compare the control voltage $V_c$ with a first reference voltage VR1, and said second comparator being connected to compare the control voltage $V_c$ with a second reference voltage VR2, wherein VR2 > VR1 and the first and second reference voltages are selected such that a small range of voltages is defined thereby, the small range of voltages encompassing the predefined, steady state voltage $V_1$ indicative of PLL circuit calibration for the selected first frequency $F_1$.

33. The calibration system of claim 32, wherein said first means for calibrating further includes:
calibration logic coupled to receive outputs from the first comparator and the second comparator and generate based thereon one of an up signal and a down signal, the up signal being generated when control voltage $V_c$ is greater than second reference voltage VR2, and the down signal being generated when control voltage $V_c$ is less than the first reference voltage VR1;
a first up/down counter coupled to receive the up and down signals generated by the calibration logic, said first up/down counter having a setting and stepping the setting up with receipt of the up signal and down with receipt of the down signal; and
a digital to analog converter coupled to the first up/down counter for outputting the bias current $I_b$ based on the setting of the first up/down counter.

34. The calibration system of claim 33, wherein said calibration logic further includes means for signaling completion of calibration based on the selected first frequency $F_1$ when control voltage $V_c$ is between the first reference voltage VR1 and the second reference voltage VR2.

35. The calibration system of claim 30, wherein said second means for calibrating the PLL circuit includes:
a demultiplexer connected between the phase comparator and the charge pump and having a control input for receiving a calibration control signal, the demultiplexer including means for discontinuing transfer of error signals from the phase comparator to the charge pump;
a second up/down counter connected to receive through the demultiplexer the error signal from the phase comparator when the charge pump discontinues receiving the error signal from the phase comparator, said second up/down counter having a setting which is stepped up with receipt of an up error signal from the phase comparator and down with receipt of a down error signal from the phase comparator;
wherein the voltage to current converter includes a gain control circuit having an array of resistors connected to an output of the second up/down counter, said gain control circuit including means for selecting a resistor path within the array of resistors based upon the setting of the second up/down counter; and
means for reflecting the control voltage $V_c$ across the filter to the output of the gain control circuit such that the converter current $I_c$ output from the voltage to current converter is equivalent to the control voltage $V_c$ divided by the resistance of the selected resistor path through the gain control circuit.

36. The calibration system of claim 35, further comprising means for signaling completion of calibration based on the frequency output $F_0$ approximately equaling the second frequency $F_2$.

37. The calibration system of claim 36, wherein said means for signaling completion of calibration includes a change sensor connected to monitor at least some output bits of the second up/down counter, said change sensor including means for outputting a calibration complete signal whenever there is no change in the monitored bits from the second up/down counter over a selected number of cycles of a reference clock.

38. The calibration system of claim 35, wherein the second means for calibrating includes an analog switch connected between reference voltage $V_2$ and the control voltage $V_c$ across the filter, said analog switch being activated simultaneously with switching of the demultiplexer such that upon disconnecting the charge pump from receiving the error signal output from the phase comparator the reference voltage $V_2$ is applied across the filter.

39. A method for calibrating a phase-locked loop (PLL) circuit having a phase comparator coupled through a charge pump, a filter, and a voltage to current converter, to a current controlled oscillator having a current input $I_0$ and a frequency output $F_0$, the current input $I_0$ to the current controlled oscillator consisting of a converter current $I_c$ from the voltage to current converter and a bias current $I_b$, said calibrating method comprising the steps of:

(a) calibrating the PLL circuit at a selected first frequency $F_1$ applied to the frequency output $F_0$ of the current controlled oscillator such that a control voltage $V_c$ across the filter is driven to a predefined, steady state voltage $V_1$, indicative of PLL circuit calibration for the selected first frequency $F_1$; and (b) calibrating the PLL circuit to a second frequency $F_2$ by disconnecting the charge pump and filter, setting the control voltage $V_c$ across the filter equal to a reference voltage $V_2$ and driving the frequency output $F_0$ of the current controlled oscillator to the second frequency $F_2$, said second frequency $F_2$ at the frequency output of the current controlled oscillator being indicative of PLL circuit calibration for the reference voltage $V_2$ set across the filter, wherein $V_2 > V_1$ and $F_2 > F_1$ and by calibrating the phase-locked loop circuit at the first frequency $F_1$ and the second frequency $F_2$, gain characteristics of the PLL are calibrated.

40. The calibrating method of claim 39, wherein said step (a) includes comparing control voltage $V_c$ against a first reference voltage VR1 and against a second reference voltage VR2, wherein when the control voltage $V_c$ is between first reference voltage VR1 and second voltage VR2, the control voltage is determined to have said predefined, steady state voltage $V_1$ indicative of PLL circuit calibration.

41. The calibrating method of claim 40, wherein said step (a) includes lowering the bias current $I_b$ when the control voltage $V_c$ is less than the first reference voltage VR1, and raising the bias current $I_b$ when the control voltage is greater than the second reference voltage VR2.

42. The calibrating method of claim 39, further comprising the step of automatically repeating steps (a)–(b) periodically such that accurate gain calibration of the PLL circuit is maintained.

43. The calibrating method of claim 39, further comprising the step of signaling completion of calibration once calibration of the phase-locked loop circuit at the first frequency $F_1$ and calibration of the PLL at the second frequency $F_2$ have been completed.

* * * * *

UNITED STATES PATENT AND TRADEMARK OFFICE
CERTIFICATE OF CORRECTION

PATENT NO. : 5,382,922
DATED : Jan. 17, 1995
INVENTOR(S) : Gersbach et al.

It is certified that error appears in the above-indentified patent and that said Letters Patent is hereby corrected as shown below:

Column 4, line 66, delete "1f" and substitute therefor --If--.
Column 6, line 46, delete "issues" and substitute therefor --Issues--.

Column 9, line 57, delete "$I_C$" and substitute therefor --$I_0$--.

Column 15, line 28, delete "$V_C$  $V_1$" and substitute therefor --$V_2 > V_1$--.
Column 15, line 30, delete "$F_R$" and substitute therefor --$F_1$--.
Column 15, line 40, delete "$V_C$" and substitute therefor --$V_2$--.
Column 15, line 42, delete "$V_n$" and substitute therefor --$V_L$--.

Signed and Sealed this

Fourth Day of July, 1995

Attest:

BRUCE LEHMAN

Attesting Officer    Commissioner of Patents and Trademarks